United States Patent [19]
Sukharev et al.

[11] Patent Number: 6,016,009
[45] Date of Patent: Jan. 18, 2000

[54] INTEGRATED CIRCUIT WITH TUNGSTEN PLUG CONTAINING AMORPHIZATION LAYER

[75] Inventors: Valeriy Y. Sukharev, Cupertino; David J. Heine, Pleasanton, both of Calif.

[73] Assignee: LSI Logic Corporation, Milpitas, Calif.

[21] Appl. No.: 09/067,545

[22] Filed: Apr. 27, 1998

Related U.S. Application Data

[62] Division of application No. 08/796,945, Feb. 7, 1997, Pat. No. 5,804,249.

[51] Int. Cl.$^7$ .................................................. H01L 23/48
[52] U.S. Cl. .......................... 257/763; 257/752; 257/753; 257/758
[58] Field of Search .................................... 257/763, 758, 257/750, 752, 753, 52, 2, 3, 4, 5

[56] References Cited

U.S. PATENT DOCUMENTS

| | | | |
|---|---|---|---|
| 5,409,861 | 4/1995 | Choi | 38/675 |
| 5,470,792 | 11/1995 | Yamada | 38/675 |
| 5,489,552 | 2/1996 | Merchant et al. | 38/675 |
| 5,661,080 | 8/1997 | Hwang et al. | 257/763 |
| 5,668,064 | 9/1997 | Park et al. | 38/675 |

OTHER PUBLICATIONS

Author Unknown, "Process Characterization", *User's Guide to Tungsten Processing*, p. 5–2 (prior to Mar. 20, 1998).

M. Iwasaki, et al., Blanket CVD–W Formed by $H_2$ Reduction of $WF_6$ on Tin for Planar Interconnection, *Materials Research Society, Symposium Proc. VLSI V*, (1990).

John E.J. Schmitz. "Chemical Vapor Deposition of Tungsten and Tungsten Silicides for VLSI/ULSI Applications", Noyes Publications, USA, 1992, pp. 32, 33, 64–67, 102–103.

M. Iwasaki, H. Itoh, T. Katayama, K. Tsukamoto and Y. Akasaka, "Blanket CVD–W Formed by $H_2$ Reduction of $WF_6$ on Tin for Planar Interconnection" Mat.Res.Soc. Synp.Proc. VLSI V, 1990, pp. 187–193.

R.V. Joshi, E. Mehter, M. Chow, M. Ishaq, S. Kang, P. Geraghty and J. McInerney, "High Growth Rate CVD—W Process For Filling High Aspect Ratio Sub–Micron Contacts/Lines" Mat.Res.Soc.Symp.Proc.VLSI V, 1990, pp. 157–166.

A. Sakamoto, H. Tamura, M. Yoshimaru and M. Ino, Proc. Appl. Phys. Soc., Japan, Fall Meeting, Paper 28A–SZD–22, p. 670 (1990).

C.C. Tang and D. W. Hess, "Plasma–enhanced Chemical Vapor Deposition of B–tungsten, a Metastable Phase" Appl. Phys. Lett., v.45(6), pp. 633–635 (1984).

*Primary Examiner*—Minh Loan Tran
*Assistant Examiner*—Hung K. Vu
*Attorney, Agent, or Firm*—Beyer & Weaver, LLP

[57] ABSTRACT

A process of forming a tungsten contact plug, on an integrated circuit (IC), that is substantially free of seam formation is described. The process includes forming a dielectric layer on a surface of a substrate, forming a via in the dielectric layer, blanket depositing a first bulk layer of tungsten on the dielectric layer and partially filling the via, blanket depositing an amorphous or a microcrystalline layer of tungsten over the first bulk layer of tungsten such that growth of tungsten grains inside the via is effectively inhibited, and blanket depositing a second bulk layer of tungsten on the amorphous or microcrystalline layer.

24 Claims, 6 Drawing Sheets

INTEGRATED CIRCUIT WITH TUNGSTEN PLUG CONTAINING AMORPHIZATION LAYER

CROSS REFERENCE TO RELATED APPLICATIONS

This application is a divisional of application Ser. No. 08/796,945, filed Feb.7, 1997, U.S. Pat. No. 5, 8704, 249, which issued on Sep. 8, 1998.

BACKGROUND OF THE INVENTION

The present invention relates to tungsten deposition processes and the resulting tungsten layers to form contact plugs in integrated circuit (IC) devices. More particularly, the present invention provides tungsten contact plugs that are substantially free of "seam" formations.

A tungsten contact plug is widely used in the art to provide electrical connection between conductive and/or semiconductive layers in an IC. Conventional processes to form such tungsten plugs include applying a dielectric layer, such as silicon dioxide ($SiO_2$), to a substrate surface that may include polysilicon, silicon (Si) or metal, e.g., aluminum or tungsten. A pattern is then formed on the dielectric layer by a standard photoresist method, and a contact hole or a "via" is etched into the dielectric layer.

Figure 1A:
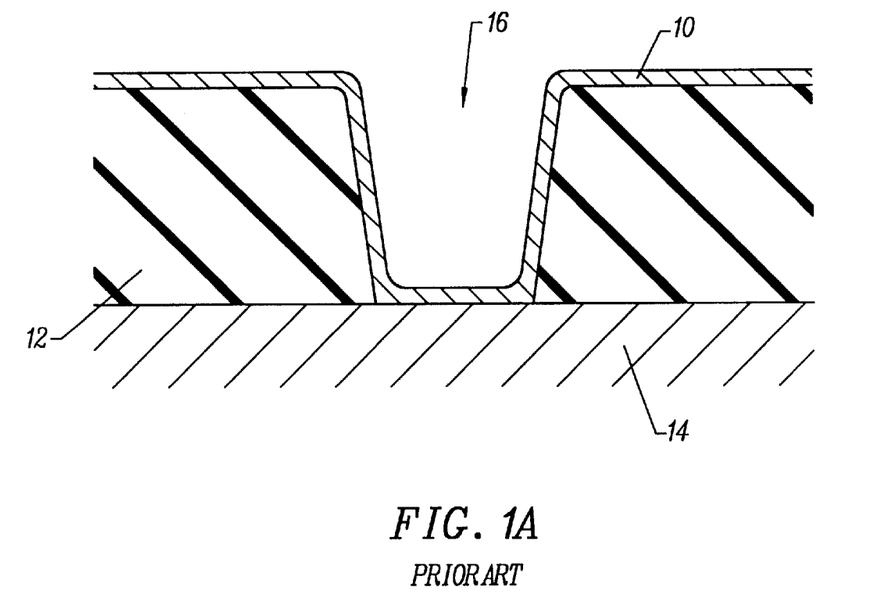
FIG. 1A–1D show some significant steps employed in a conventional process for fabricating a tungsten contact plug.

FIGS. 1A–1D show a conventional method for transforming such a via into a tungsten contact plug. FIG. 1A shows a via 16 that is formed inside a $SiO_2$ layer 12, which is disposed above a silicon substrate 14, for example. A titanium layer 10 is blanket deposited over the entire surface, as shown, partially filling via 16. The titanium layer, due to its high-electrical conductivity, ensures a good ohmic contact with the underlying silicon substrate. In other applications, the titanium layer may ensure an ohmic contact with such underlying layers such as a metallization layer or a polysilicon layer.

Figure 1B:
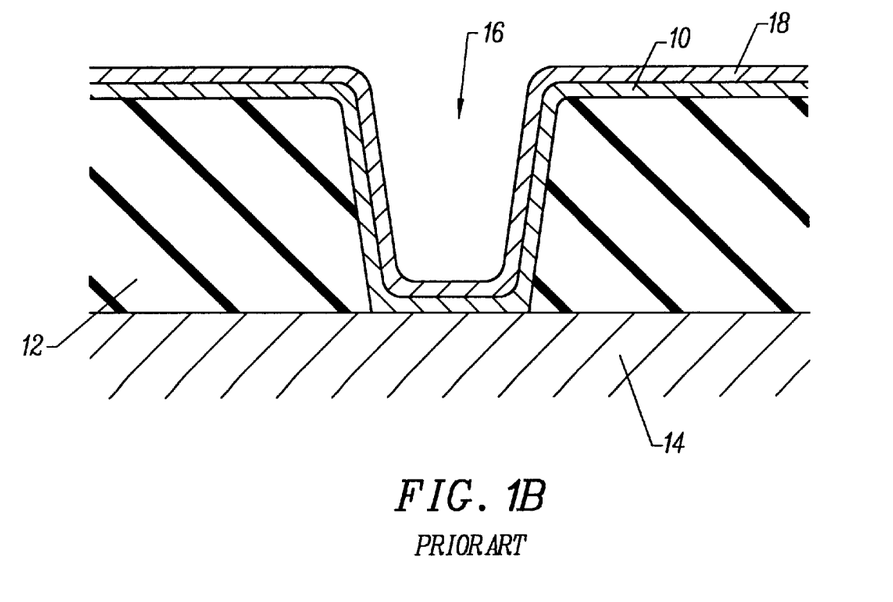

As shown in FIG. 1B, a layer of titanium nitride (TiN) 18 is typically blanket deposited over via 16 and dielectric layer 12 of FIG. 1A by means of sputtering or chemical vapor deposition. Titanium nitride (TiN) layer 18 acts as a barrier layer to prevent diffusion of fluoride atoms from getting into the substrate. The fluoride atoms are typically produced in subsequent chemical vapor deposition steps that involve depositing tungsten into the vias. TiN layer 18 also facilitates uniform nucleation of tungsten grains, which grow at sidewalls and the bottom of via 16, and thereby promotes adhesion of the bulk tungsten layer to titanium and $SiO_2$ layers disposed below TiN layer 18.

Figure 1C:
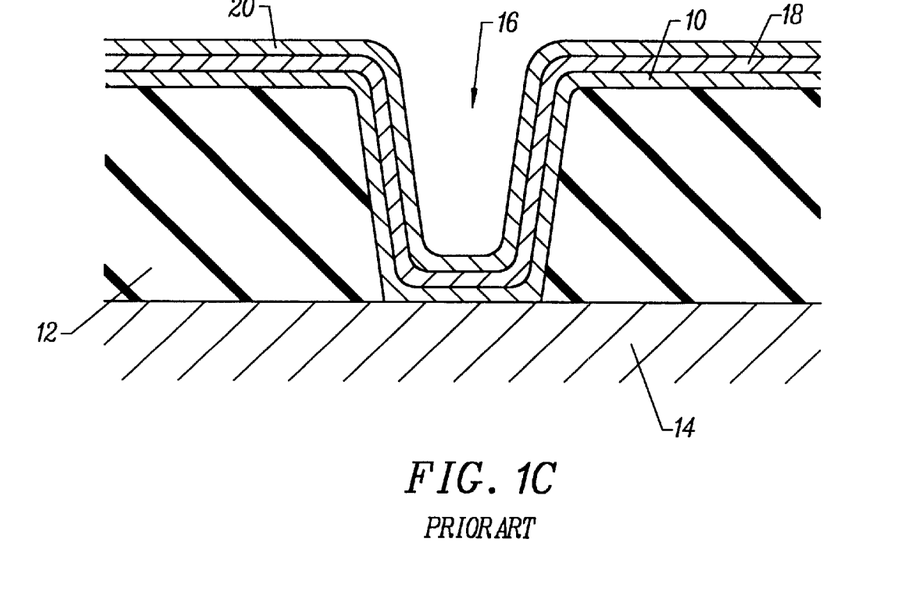

Next, as shown in FIG. 1C a nucleation layer 20 of tungsten is blanket deposited over the partially filled via structure of FIG. 1B typically by chemical vapor deposition. The chemical vapor deposition process, in this step, is conducted in the presence of silane ($SiH_4$) and tungsten fluoride ($WF_6$), where a flow ratio of silane ($SiH_4$) and tungsten fluoride ($WF_6$) gases into the deposition chamber is maintained at a value that is below about 1. Here the more readily reduced $SiH_4$ chemistry is desirable as it is less aggressive on the substrate and yields a shorter nucleation time. Under these conditions, nucleation layer 20 is formed over the sidewalls and bottom of via 16. Deposition of nucleation layer 20 continues until a polycrystal layer of tungsten is deposited over TiN layer 18. For more information on this process, reference may be made to M. Iwasaki, H. Itoh, T. Katayama, K. Tsukamoto and Y. Akasaka, Tungsten Workshop V, (1990), which is incorporated herein by reference for all purposes.

Figure 1D:
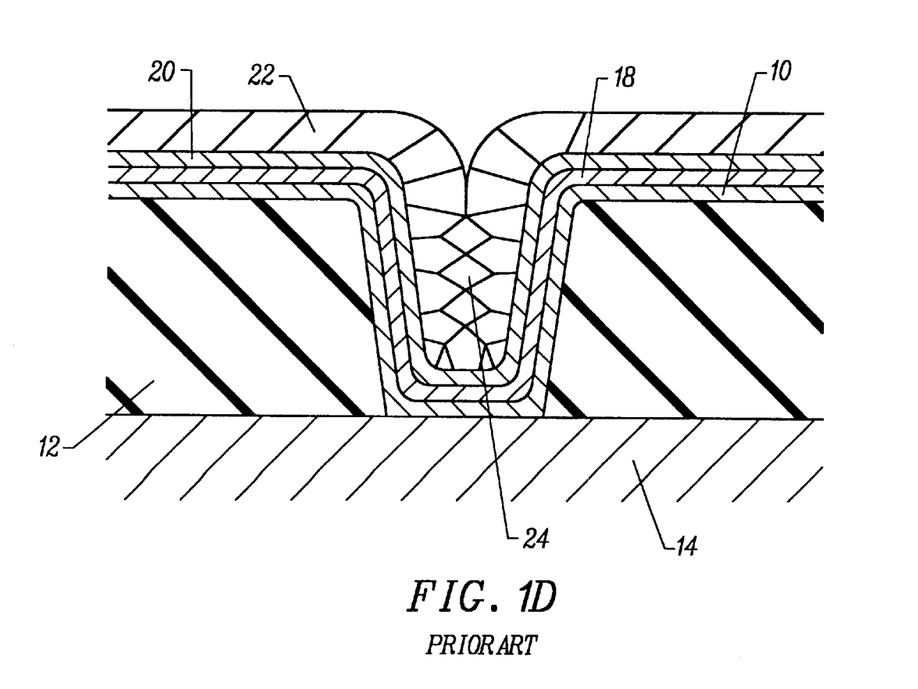

After tungsten nucleation layer 20 is formed, bulk deposition of tungsten begins. FIG. 1D shows that a bulk layer 22 of tungsten is blanket deposited over nucleation layer 20 by chemical vapor deposition. A bulk layer 22 of tungsten is produced, in this step, from $WF_6$ in the presence of hydrogen gas, which reduces $WF_6$ to produce tungsten and hydrogen fluoride (HF) gas that dissipates easily. The bulk deposition of tungsten proceeds until via 16 is completely filled or totally closed. Chemimechanical polishing or plasma assisted etching, is then performed to remove the residual layers deposited on the open surface of dielectric layer 12 to form a contact plug.

Referring back to the bulk deposition process, most current processes for filling of contact holes or vias employ a blanket tungsten deposition, which is characterized by isotropic tungsten grain growth, i.e., tungsten grains grow on all areas of the via including the inner sidewalls and bottom of the via. The blanket deposition of bulk layer 22, as shown in FIG. 1D, accordingly results in grain growth on all areas inside via 16, particularly on the inner side-walls of via 16. Note that tungsten grains grow as columnar structures away from the side and bottom walls of via 16. As the tungsten grains continue to grow from the side-walls of via 16, they eventually physically contact one another at the center of via 16. By the time tungsten grains cease to grow, bulk layer 22 has a large mean tungsten grain size, especially on the inner side-walls of via 16.

Unfortunately, the large mean tungsten grain size creates a pronounced porous "seam" 24 at about a mid-region of via 16, as shown in FIG. 1D. Seam 24 is undesirable because it provides easy access to corrosive liquids that are employed in subsequent IC wafer fabrication steps, for example, hydrogen peroxide ($H_2O_2$), potassium hydroxide (KOH), ferric compounds such as ferric nitrate ($Fe(NO_3)_2$) and the like commonly employed in the chemi-mechanical polishing process mentioned above. Of course, seam 24 would also provide an easy diffusion pathway for other undesirable particles and compounds to diffuse into the contact plug. Once these undesirable compounds find their way into the contact plug, they may react with the tungsten inside the contact plug at subsequent high temperature processes. Consequently, the depletion of tungsten can reduce the electrical conductivity of the contact plug significantly, disabling any electrical connection made by the via, and thereby rendering the entire IC device inoperable. This translates into a substantially lower IC yield.

What is needed is a tungsten contact plug that is substantially free of seams or other pathway to allow undesirable particles and compounds to diffuse into the contact plug.

SUMMARY OF THE INVENTION

To achieve the foregoing, one aspect of the present invention provides a process of forming a tungsten contact plug, on an integrated circuit (IC), that is substantially free of seam formation. The process includes forming a dielectric layer on a surface of a substrate, forming a via in the dielectric layer, blanket depositing a first bulk layer of tungsten on the dielectric layer and partially filling the via, blanket depositing an amorphous or a microcrystalline layer of tungsten over the first bulk layer of tungsten such that growth of tungsten grains inside the via is effectively inhibited, and blanket depositing a second bulk layer of tungsten on the amorphous or microcrystalline layer.

In one embodiment of the present invention, the step of blanket depositing the second bulk layer of tungsten completely fills the via. In another embodiment of the present invention, the step of blanket depositing the amorphous or microcrystalline tungsten layer and the step of blanket depositing the second bulk layer of tungsten are repeated at least once to completely fill the via. After the via is completely filled, the process of forming the tungsten contact plug may further include subjecting the wafer to chemimechanical polishing.

The step of blanket depositing the first and second bulk layers of tungsten may include depositing tungsten from tungsten hexafluoride ($WF_6$) and hydrogen ($H_2$) gas by a chemical vapor deposition process. The step of blanket depositing the amorphous or microcrystalline layer includes depositing tungsten from tungsten hexafluoride ($WF_6$) and silane ($SiH_4$) by a chemical vapor deposition process. During this amorphization step, a flow ratio of $SiH_4/WF_6$ is generally maintained at between about 0.9 and about 1.3 and preferably maintained at between about 1.0 and about 1.3. Furthermore, the substrate temperature may also be maintained at between about 350 and about 475° C. to facilitate the deposition of the amorphous or microcrystalline layer. The flow rate of $SiH_4$ gas is between about 20 and about 75 standard cubic centimeter per minute (sccm) and the flow rate of $WF_6$ gas is also between about 20 and about 75 standard cubic centimeter per minute (sccm). The step of chemical vapor deposition, during amorphization, may be generally carried out at a pressure that is between about 10 and about 80 Torr and preferably carried out at a pressure that is between about 20 and about 50 Torr. In one embodiment, the step of blanket depositing the amorphous or microcrystalline layer in the present invention may be carried out after the via is between about 75% and about 85% closed.

The process of forming a tungsten contact plug may further include forming a layer of titanium in the via prior to the step of blanket depositing the first bulk layer of tungsten. Titanium, due to its high electrical conductivity, ensures a good ohmic contact with the underlying substrate. The process may further still include a layer of titanium nitride (TiN) deposited over the titanium layer. The titanium nitride layer acts as a barrier layer to prevent the diffusion of fluoride atoms into the substrate. Titanium nitride also acts as an adhesion layer to the dielectric layer. The process may further still include blanket depositing a nucleation layer of tungsten in the via by the more readily reduced $SiH_4$ chemistry as it is less aggressive on the substrate and yields a shorter nucleation time. The step of blanket depositing the nucleation layer of tungsten may include depositing tungsten from $WF_6$ gas and $SiH_4$ gas under a flow ratio of $SiH_4$ gas to $WF_6$ gas that is below 1.

In another aspect, the present invention provides a tungsten contact plug in an integrated circuit. The tungsten contact plug includes a via formed on a dielectric layer of the integrated circuit, a first bulk layer of tungsten disposed in the via, a first amorphous or microcrystalline layer of tungsten disposed on the first bulk layer of tungsten such that the first amorphous or microcrystalline layer of tungsten effectively blocks grain growth from the first bulk layer of tungsten, a second bulk layer of tungsten disposed on the microcrystalline layer of tungsten.

The first amorphous or microcrystalline layer of tungsten forms a thin covering of tungsten which interrupts tungsten grain growth from the first bulk layer. It is, therefore, important that during the amorphization step, the first amorphous or microcrystalline layer should be grown to a sufficient thickness so that it may effectively inhibit tungsten grain growth from the first bulk layer. However, the first amorphous or microcrystalline layer should not be too thick as the conductivity of the first amorphous or microcrystalline layer of tungsten is somewhat lower than that of crystalline tungsten. Thus, too thick an amorphous or microcrystalline tungsten layer, however, will likely reduce the electrical conductivity of the contact plug and provide a poor electrical connection. It is, therefore, important to deposit the first amorphous or microcrystalline layer in sufficiently high amounts to effectively inhibit tungsten grain growth, but not lower conductivity of the contact plug.

For a via of about 0.5 micrometer ($\mu$m) in width, the first amorphous or microcrystalline layer of tungsten, in the tungsten plug, may generally have a thickness of between about 200 and about 800 Angstroms (Å) and preferably have a thickness that is between about 400 and about 600 Angstroms (Å). The mean grain size of tungsten in the amorphous layer is between about 350 and about 400 Å.

The first bulk layer must be of appropriate thickness. If the first bulk layer is too thick, the mean tungsten grain size may be large enough to contact opposing grains and thereby create the undesired seams. For a via of about 0.5 micrometer ($\mu$m) in width, the thickness of first bulk layer may generally range between about 400 and about 1800 Å. The mean grain size of tungsten in the first bulk layer is between about 320 and about 480 Å.

For a via of about 0.5 $\mu$m in width, the thickness of the second bulk layer is between about 400 and 1000 Å. The resulting mean grains size of tungsten in the second bulk layer is smaller, e.g., between about 330 and about 410 Å, than the mean grain size of tungsten in the bulk layer of a tungsten contact plug fabricated according to conventional processes. This represents about 9% reduction in the mean grain size from the mean grain size of the tungsten bulk layer fabricated according to conventional processes. This is because by the time second bulk layer is deposited, most of the via is filled with the other layers. New tungsten crystal grains grown in the second bulk layer cannot, therefore, grow to very large dimension before encountering crystals growing from opposite walls of the via. There is also a 47% reduction in the standard deviation of the grain size distribution in the second bulk layer of tungsten.

The second bulk layer of tungsten may be deposited in sufficient amount to completely fill the via. The tungsten contact plug may further include at least a second amorphous or microcrystalline layer of tungsten disposed on the second bulk layer of tungsten and at least a third bulk layer of tungsten that is disposed on the second amorphous or microcrystalline layer of tungsten.

The tungsten contact plug of the present invention may further include a nucleation layer of tungsten disposed beneath the first layer of tungsten. The tungsten contact plug may further still include a layer of titanium disposed in the via and a layer of titanium nitride disposed on the layer of titanium and beneath the first bulk layer of tungsten. The dielectric layer of the tungsten contact plug is formed on a substrate selected from the group consisting of silicon, metal and polysilicon.

These and other features of the present invention will be described in more detail below in the detailed description of the invention and in conjunction with the following figures.

DETAILED DESCRIPTION OF THE PREFERRED EMBODIMENTS

The present invention provides a tungsten plug substantially free of seam formations. In the following description, numerous specific details are set forth in order to provide a thorough understanding of the present invention. It will be apparent, however, to one skilled in the art that the present invention may be practiced without limitation to some or all of these specific details.

It has been observed that as the mean grain size of tungsten increases, a more porous seam having a greater void area is produced at about the mid-region of the via. In contrast, as the mean grain size of tungsten reduces or becomes finer, a less porous seam is produced. Of course, when the mean grain size of tungsten is sufficiently small, the seam is so small that it does not pose a problem. A tungsten contact plug according to the present invention, therefore, includes a relatively small mean grain size to eliminate or reduce the seam formation resulting from conventional fabrication processes.

Figure 2A:
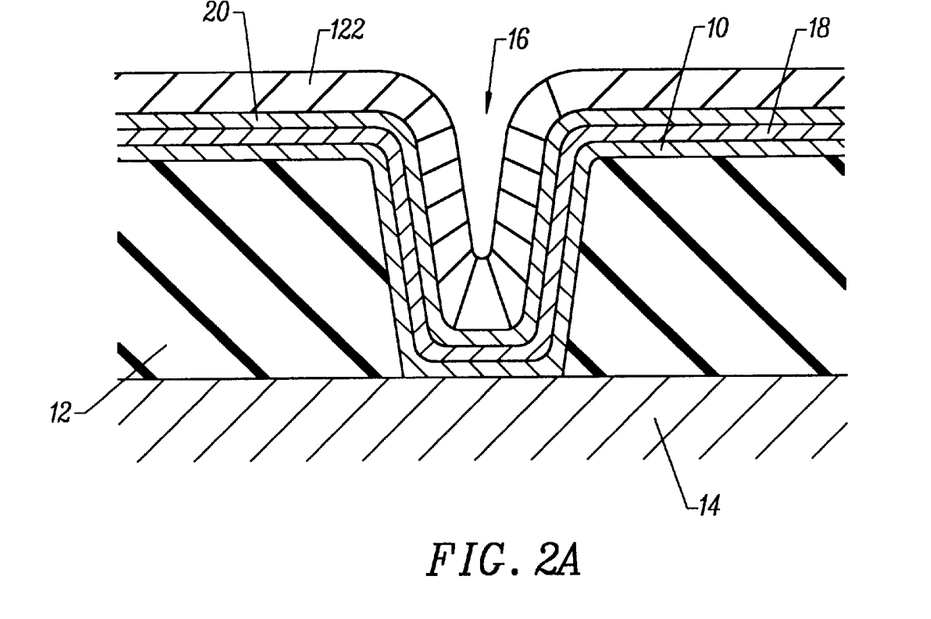
FIGS. 2A–2E show some significant steps employed in a process for fabricating a tungsten contact plug, according to one embodiment of the present invention.
Figure 2B:
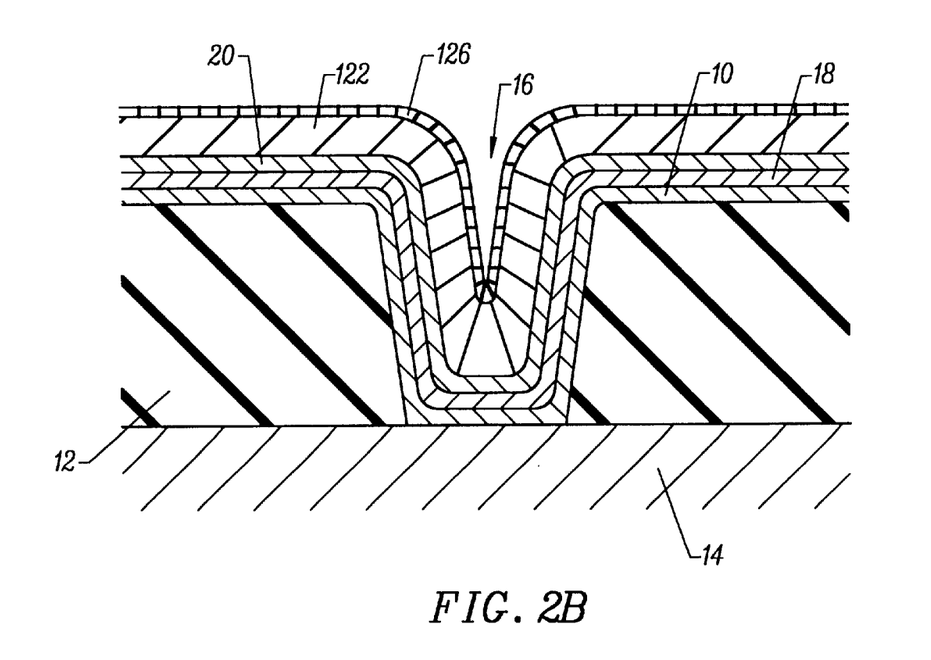
Figure 2C:
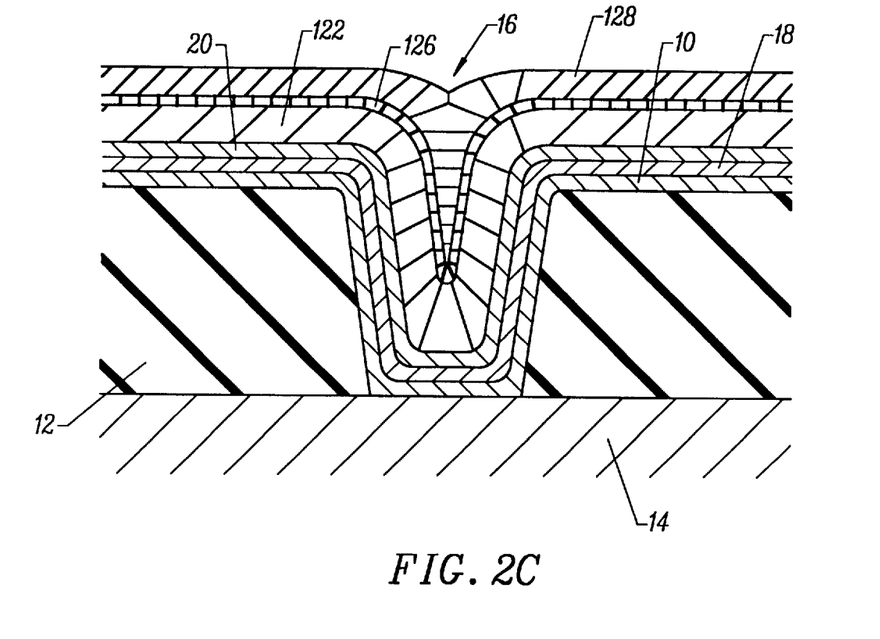

In one embodiment of the present invention, titanium, titanium nitride and the nucleation layer of tungsten are deposited according to conventional contact plug fabrication processes, an example of which is shown in FIGS. 1A–1C. After the deposition of these layers, fabrication of a tungsten contact plug, according to one embodiment of the present invention, continues as shown in FIGS. 2A–2C. FIG. 2A shows a blanket deposition of a first bulk layer 122 over nucleation layer 20, as shown in FIG. 2C, partially filling via 16. In one embodiment, first bulk layer 122 of the present invention is deposited by chemical vapor deposition in the presence of tungsten fluoride ($WF_6$) and hydrogen ($H_2$). The hydrogen ($H_2$) reduces tungsten fluoride ($WF_6$) to produce tungsten, which is deposited on nucleation layer 20, and hydrogen fluoride (HF) gas that dissipates easily. The reaction parameters or conditions employed during this deposition step are similar to parameters or conditions employed during the conventional bulk deposition processes of tungsten. In one specific embodiment, the ratio of $H_2$ to $WF_6$ is about 20:1 and the chamber pressure is maintained at about 80 Torr. The deposition of first bulk layer 122 continues until a layer of appropriate thickness is deposited.

It is important to note that first bulk layer 122 must be of appropriate thickness. If first bulk layer 122 is too thick, the mean tungsten grain size may be large enough to contact opposing grains and thereby create the undesired seams. For a via of about 0.5 micrometer ($\mu$m) in width, the thickness of first bulk layer may generally range between about 400 and about 1800 Angstroms (Å). The mean grain size of tungsten is between about 320 and about 480 Angstroms (Å). In one embodiment of the present invention, deposition of first bulk layer 122, therefore, continues until between about 75% and about 85% of the via aperture is filled.

Next, as shown in FIG. 2B, a microcrystalline or a substantially amorphous tungsten layer 126 (hereinafter referred to as "amorphous" layer to facilitate discussion) is blanket deposited over first bulk layer 122 by chemical vapor deposition. The mean grain size in amorphous layer 126 is between about 350 and about 400 Å. Chemical vapor deposition of microcrystalline or amorphous tungsten may be accomplished by introducing silane ($SiH_4$) and $WF_6$ gases into a deposition chamber at a flow ratio of $SiH_4/WF_6$ greater than or equal to one. During the deposition process, substrate 14 is typically maintained at a temperature that may be between about 350 and about 475° C.

TABLE 1

| PARAMETERS FOR AMORPHIZATION | | GENERAL RANGE | PREFERRED RANGE | MORE PREFERRED RANGE OR VALUE |
|---|---|---|---|---|
| FLOW RATES (sccm) | $SiH_4$ | 20–75 | 20–40 | 30 |
|  | $WF_6$ | 20–75 | 20–40 | 30 |
| FLOW RATIO $SiH_4/WF_6$ | | 0.9–1.3 | 1.0–1.1 | 1.0 |
| TEMPERATURE (° C.) | | 350–475 | 400–430 | 415 |
| PRESSURE (Torr) | | 10–80 | 20–50 | 30 |
| $H_2$ Flow (sccm) | | 500–1500 | 800–1200 | 1000 |

Table 1 sets forth approximate ranges of the important parameters, e.g. flow rates of $SiH_4$ and $WF_6$, flow ratios of $SiH_4/WF_6$, temperature and pressure, employed in a typical reaction chamber during the chemical vapor deposition to produce amorphous layer 126. Flow rates of $SiH_4$ and $WF_6$ refer to the flow rates at which $SiH_4$ and $WF_6$ are introduced into the deposition chamber. The flow rate of $SiH_4$ is generally between about 20 and about 75 standard cubic centimeter per minute (sccm), preferably between about 20 and about 40 standard cubic centimeter per minute (sccm), and more preferably about 30 sccm. Similarly, the flow rate of $WF_6$ is generally between about 20 and about 75 sccm, preferably between about 20 and about 40 sccm, and more preferably about 30 sccm.

Flow ratio of $SiH_4/WF_6$ is an important parameter as it has been observed that tungsten layer composition and texture are functions of the $SiH_4/WF_6$ chemistry. If the gas flow ratio of $SiH_4/WF_6$ is too high, e.g., above about 1.3, the amorphization step suffers from gas phase nucleation in which elemental tungsten forms in the gas phase rather than on the substrate. Obviously, the growth of tungsten should take place at the substrate surface as opposed to being formed as particles in the gas phase. Therefore, flow ratio may generally be between about 0.9 and about 1.3 and preferably be between about 1.0 and about 1.3, and more preferably be about 1.0. If the flow ratio of $SiH_4/WF_6$ is too low, e.g., much smaller than 1, a nucleation layer of tungsten is deposited in the via and such a nucleation layer is of course not sufficiently amorphous.

Pressure and temperature refer to the pressure and temperature of the deposition chamber during, deposition conditions. According to Table 1, the pressure generally ranges between about 10 and about 80 Torr, preferably ranges between about 20 and about 50 Torr and is more preferably at about 30 Torr. The temperature of the deposition chamber generally ranges between about 350 and about 475° C., preferably ranges between about 400 and about 430° C. and is more preferably at about 415° C.

Amorphous layer 126 forms a thin covering of tungsten, which interrupts tungsten grain growth from bulk layer 122. It is, therefore, important that during the amorphization step, amorphous layer 126 should be grown to sufficient thickness so that it may effectively inhibit tungsten grain growth from bulk layer 122. However, layer 126 should not be too thick as the conductivity of amorphous tungsten is somewhat lower than that of crystalline tungsten. Thus, too thick an amorphous layer 126 will likely reduce the electrical conductivity of the contact plug and provide a poor electrical connection. It is, therefore, important to deposit amorphous layer 126 in sufficiently high amounts to effectively inhibit tungsten grain growth, but not in excessive amounts to unduly lower the conductivity of the contact plug. For a via of about 0.5 μm in width, the thickness of amorphous layer 126 may generally range between about 200 and about 800 Angstroms (Å), preferably range between about 400 and about 600 Å, and more preferably be about 400 Å.

Additionally, because the tungsten layer produced during the amorphization step is marked by poor step coverage and has poor conformality, depositing a thick amorphous layer 126 may result in an overhang structure. These problems associated with poor conformality of amorphous layer 126 may also present itself when first bulk layer 122 is thick enough to nearly fill the via 16, as mentioned above. Of course, such a void area in the contact plug is undesirable as it lowers the electrical conductivity of the plug.

FIG. 2C shows that a second bulk layer 128 of tungsten is blanket deposited over amorphous layer 126, completely filling the aperture of via 16. Bulk layer 128 may be deposited by chemical vapor deposition employing the same chemistry, i.e., $WF_6/H_2$, and under the same parameters or conditions as first bulk layer 122 of tungsten. The thickness of second bulk is generally between about 400 and about 1000 Å. During the initial stages of depositing second bulk layer 128, amorphous layer 126 provides newly created nucleation centers to promote the growth of new tungsten grains. The deposition of amorphous layer 126 may, therefore, be characterized as the introduction of a second nucleation step prior to depositing second bulk layer 128, which is employed to completely fill via 16.

The resulting mean grain size of tungsten in second bulk layer 128 is substantially smaller, e.g., between about 330 and about 410 Å, than the mean grain size of tungsten in the bulk layer of a tungsten contact plug fabricated according to conventional processes. This represents about 9% reduction in the mean grain size from the mean grain size of the tungsten bulk layer fabricated according to conventional processes. The is because by the time second bulk layer 128 is deposited, most of via 16 is filled with the other layers. New tungsten crystal grains grown in layer 128 cannot, therefore, grow to very large dimension before encountering crystals growing from opposite walls of the via. Remember that an amorphous layer of tungsten effectively interrupts tungsten grain growth from the underlying first bulk layer 122. Consequently, a very small amount of second bulk layer 128 is required to completely fill via 16.

There is also a 47% reduction in the standard deviation of the grain size distribution in the second bulk layer. Thus, tungsten grains in second bulk layer 128, according to the present invention, are more uniform in size than tungsten grains in the bulk layer fabricated by conventional processes. The fine, uniform tungsten grains in second bulk layer of the present invention can tightly interlock with adjacent crystals to reduce or effectively eliminate the seam formation described above.

Figure 2D:
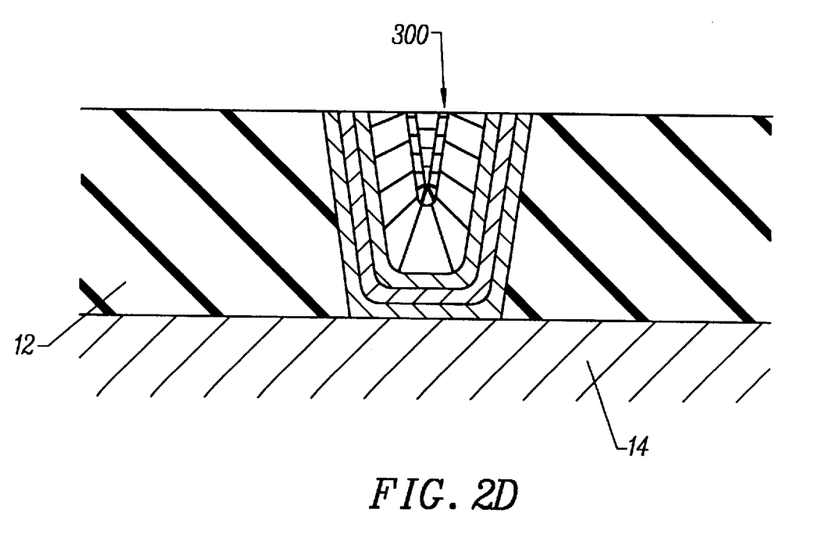
Figure 2E:
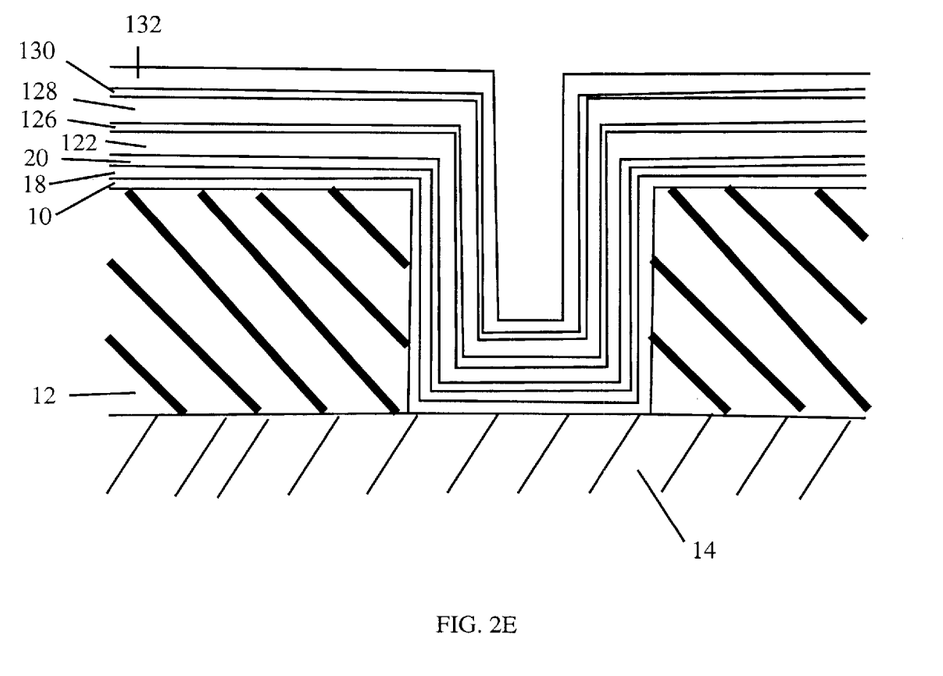

It is important to note, that in some applications second bulk layer 128 may not be deposited to completely fill the aperture of via 16. As shown in FIG. 2E a second substantially amorphous layer 130, which is very similar to amorphous layer 126, can be blanket deposited over the second bulk layer 128 and the second amorphous layer can be capped by another bulk layer of tungsten 132 that is similar to first and second bulk layers. Depending on the application, one skilled in the art may appreciate that in this manner several layers of bulk and substantially amorphous tungsten can be deposited to carefully control the contact plug morphology without seam formation.

It should be borne in mind that the various values for thicknesses and mean grain sizes of layers (e.g., first bulk, amorphous or second bulk layers of tungsten) provided above should serve as examples and are not intended to limit the invention in any way. As mentioned above, these values for thicknesses and mean grain sizes apply for a via of about 0.5 μm in width. Of course, one skilled in the art might appreciate that these values may vary depending on the via dimensions.

In one embodiment, this chemical vapor deposition process of the present invention may be carried out in a Single Chamber System XZ, commercially available from Applied Materials of Santa Clara, Calif. In another embodiment of the present invention, chemical vapor deposition may be carried out batchwise in a deposition chamber, such as Batch Reactor C-1 or C-2, commercially available from Novellus of San Jose, Calif. These batch reactors come equipped with five different stations and each station includes a pedestal for processing substrates. In conventional operation, the first station supplies $SiH_4$ and $WF_6$ gases during the tungsten deposition step. This station may be employed to deposit nucleation layer 120 of FIG. 1C. Conventionally, the other stations carry out bulk deposition by supplying supplies $WF_6$ and $H_2$ in various ratios. In an embodiment of this invention, the multistation reactor is modified so that another station (other than the first) may be adapted to provide $SiH_4$ gas to effectively carry out the amorphization step described in FIG. 2B. Batchwise deposition of tungsten in this embodiment, therefore, allows the various tungsten layers to be fabricated simultaneously and can thereby increase the throughput.

After the various tungsten layers have been deposited to completely fill the via, the residual tungsten layers overlying the dielectric layer and deposited above the via are removed by an etch back process to form a contact plug. FIG. 2D shows a planarized substrate surface having dielectric layer 12 and contact plug 300 having substantially the same elevation with respect to the substrate surface. In one embodiment, the etch-back process of the present invention may include chemi-mechanical polishing, which involves mounting the substrate upside down on a holder and rotating it on against a polishing pad mounted on a pallet, which is rotating in the other direction. A slurry containing a chemical capable of selectively etching some material on the substrate and an abrasive that physically removes the layer to be planarized, is flowed between the wafer and the polishing pad. After the polishing has concluded, the substrate surface includes a contact plug according to the present invention.

Figure 3A:
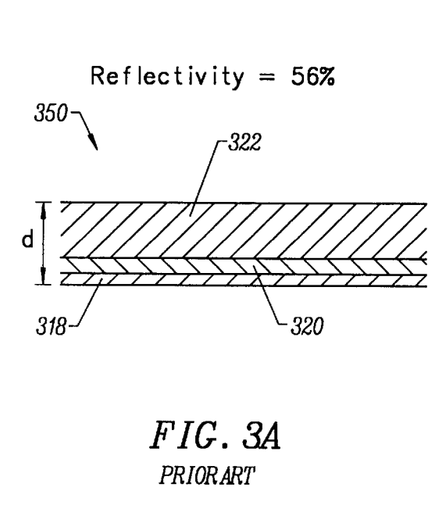
FIG. 3A shows a layer stack employed in a reflectivity experiment and designed to simulate the layered structure in a tungsten contact plug that is fabricated according to conventional processes.
Figure 3B:
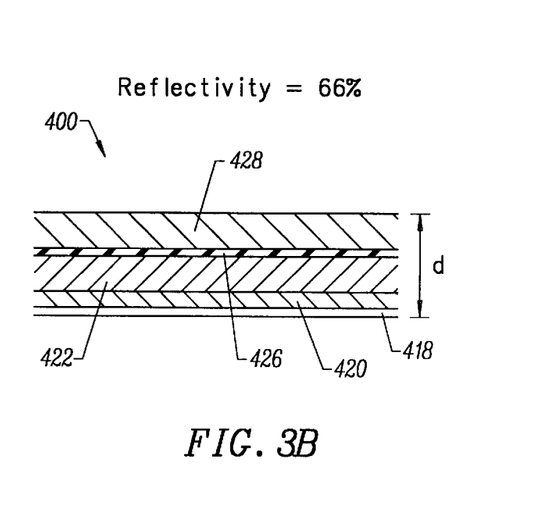
FIG. 3B shows a layer stack employed in a reflectivity experiment and designed to simulate the layered structure in a tungsten contact plug that is fabricated according to one embodiment of the present invention.

To test the effect of the present invention on grain size, two light scattering experiments were performed. In one experiment a layered structure according to one embodiment of the present invention was produced and in a second experiment a layered structure of a conventional fabrication process was produced. FIG. 3A shows a layered stack 350, which includes a layer of titanium nitride 318, a nucleation layer of tungsten 320 and a bulk layer of tungsten 322, to simulate the layered structure formed inside the contact plug by conventional fabrication processes. FIG. 3B shows a layered stack 400, which includes a layer of titanium nitride 418, a nucleation layer of tungsten 420 and a substantially amorphous tungsten layer 426 sandwiched between two bulk layers of tungsten 428 and 422, to simulate the layered structure formed inside the contact plug according to one embodiment of the present invention. The reflectivity of layer stack 350 was measured at about 56% and the reflectivity of layer stack 400 was measured at about 66%. It is well known that large grains scatter more light and have lower reflectivity, therefore, the contact plug according to the present invention appears to contain finer grains of tungsten than the contact plug fabricated according to conventional processes.

Although the foregoing design has been described in some detail for purposes of clarity of understanding, it will be apparent that certain chances and modifications may be practiced within the scope of the appended claims. For example, while wafer exposure has been described as being performed with a stepper, there is in principle no reason why the process can not also be performed with other exposure apparatus such as projection scanners and contact/proximity aligners. Therefore, the present embodiments are to be considered as illustrative and not restrictive, and the invention is not to be limited to the details given herein, but may be modified within the scope of the appended claims.

What is claimed is:

1. A tungsten contact plug in an integrated circuit, comprising:

a via formed in a dielectric layer of said integrated circuit;

a first bulk layer of tungsten disposed in said via;

a first amorphous or microcrystalline layer of tungsten disposed on said first bulk layer of tungsten, said first amorphous or microcrystalline layer of tungsten blocking grain growth from said first bulk layer of tungsten;

a second bulk layer of tungsten disposed on said first amorphous or microcrystalline layer of tungsten.

2. The tungsten contact plug of claim 1, wherein said first amorphous or microcrystalline layer of tungsten has a thickness of between about 200 and about 800 Angstroms (Å).

3. The tungsten contact plug of claim 2, wherein said first amorphous or microcrystalline layer of tungsten has a thickness of between about 400 and about 600 Angstroms (Å).

4. The tungsten contact plug of claim 1, wherein said first bulk layer of tungsten has a thickness that is between about 400 and about 1800 Å.

5. The tungsten contact plug of claim 1, wherein said second bulk layer of tungsten has a thickness that is between about 400 and about 1000 Å.

6. The tungsten contact plug of claim 1, wherein said second bulk layer of tungsten completely fills said via.

7. The tungsten contact plug of claim 1, further comprising at least a second amorphous or microcrystalline layer of tungsten disposed on said second bulk layer of tungsten and at least a third bulk layer of tungsten that is disposed on said second amorphous or microcrystalline layer of tungsten.

8. The tungsten contact plug of claim 1, further comprising a nucleation layer of tungsten disposed beneath said first bulk layer of tungsten.

9. The tungsten contact plug of claim 1, further comprising:

a layer of titanium disposed in said via; and a layer of titanium nitride disposed on said layer of titanium and beneath said first bulk layer of tungsten.

10. The tungsten contact plug of claim 1, wherein said dielectric layer is formed on a substrate selected from the group consisting of silicon, metal and polysilicon.

11. The tungsten contact plug of claim 1, wherein a mean grain size of said first bulk layer of tungsten is between about 320 and about 480 Å.

12. The tungsten contact plug of claim 1, wherein a mean grain size of said first amorphous or microcrystalline layer of tungsten is between about 350 and about 400 Å.

13. The tungsten contact plug of claim 1, wherein a mean grain size of said second bulk layer of tungsten is between about 330 and about 410 Å.

14. An integrated circuit having a contact plug means for electrically connecting two vertically separated conductive or semiconductive layers, said contact plug means comprising a via formed in a dielectric layer, said via including an amorphous or microcrystalline tungsten layer means for inhibiting grain growth in a first bulk tungsten layer and promoting grain growth in a second bulk tungsten layer that is disposed above said amorphous or microcrystalline tungsten layer means, said amorphous or microcrystalline tungsten layer means is disposed above said first bulk tungsten layer.

15. The integrated circuit of claim 14, further comprising a nucleation layer means provided on side-walls of said via for promoting grain growth in said first bulk tungsten layer disposed above said nucleation layer means.

16. The integrated circuit of claim 14, further comprising a barrier layer means in said via for preventing diffusion of particles into said dielectric layer and facilitating adhesion of said first bulk tungsten layer.

17. The integrated circuit of claim 14, further comprising an ohmic contact means in said via for providing an ohmic contact between said contact plug means and an underlying integrated circuit substrate.

18. The integrated circuit of claim 14, wherein said amorphous or microcrystalline tungsten layer means has a thickness of between about 200 and about 800 Å.

19. The integrated circuit of claim 18, wherein said amorphous or microcrystalline tungsten layer means has a thickness of between about 400 and about 600 Å.

20. The integrated circuit of claim 14, wherein said first bulk layer of tungsten has a thickness that is between about 400 and about 1800 Å.

21. The integrated circuit of claim 14, wherein said second bulk layer of tungsten has a thickness that is between about 400 and about 1000 Å.

22. The integrated circuit of claim 14, wherein a mean grain size of said first bulk layer of tungsten is between about 320 and about 480 Å.

23. The integrated circuit of claim 14, wherein a mean grain size of said amorphous or microcrystalline layer means is between about 350 and about 400 Å.

24. The integrated circuit of claim 14, wherein a mean grain size of said second bulk layer of tungsten is between about 330 and about 410 Å.

* * * * *